United States Patent [19]

Rowe et al.

[11] Patent Number: 4,608,272

[45] Date of Patent: Aug. 26, 1986

[54] METHOD OF REDUCING OPTICAL COATING ABSORPTANCE

[75] Inventors: James M. Rowe, Torrance; Paul Kraatz; Samuel J. Holmes, both of Redondo Beach, all of Calif.

[73] Assignee: Northrop Corporation, Hawthorne, Calif.

[21] Appl. No.: 198,602

[22] Filed: Oct. 20, 1980

[51] Int. Cl.⁴ ............................................. B05D 3/06
[52] U.S. Cl. ................................. 427/53.1; 427/162; 427/164; 427/166
[58] Field of Search ...................... 427/53.1, 162, 164, 427/166

[56] References Cited

U.S. PATENT DOCUMENTS 3,926,508 12/1975 Harmsen et al. ................. 427/164
4,024,291 5/1977 Wilmanns ......................... 427/166

Primary Examiner—John H. Newsome
Attorney, Agent, or Firm—Terry J. Anderson

[57] ABSTRACT

A laser or other light beam is directed onto an optical substrate while an optical coating is being vacuum deposited thereon. The laser has a wavelength at or near that at which a reduced absorptance of the coating is desired. In one embodiment, the substrate is heated electrically. Thin film optical coatings having a substantially lowered absorptance are made in this manner.

9 Claims, 1 Drawing Figure

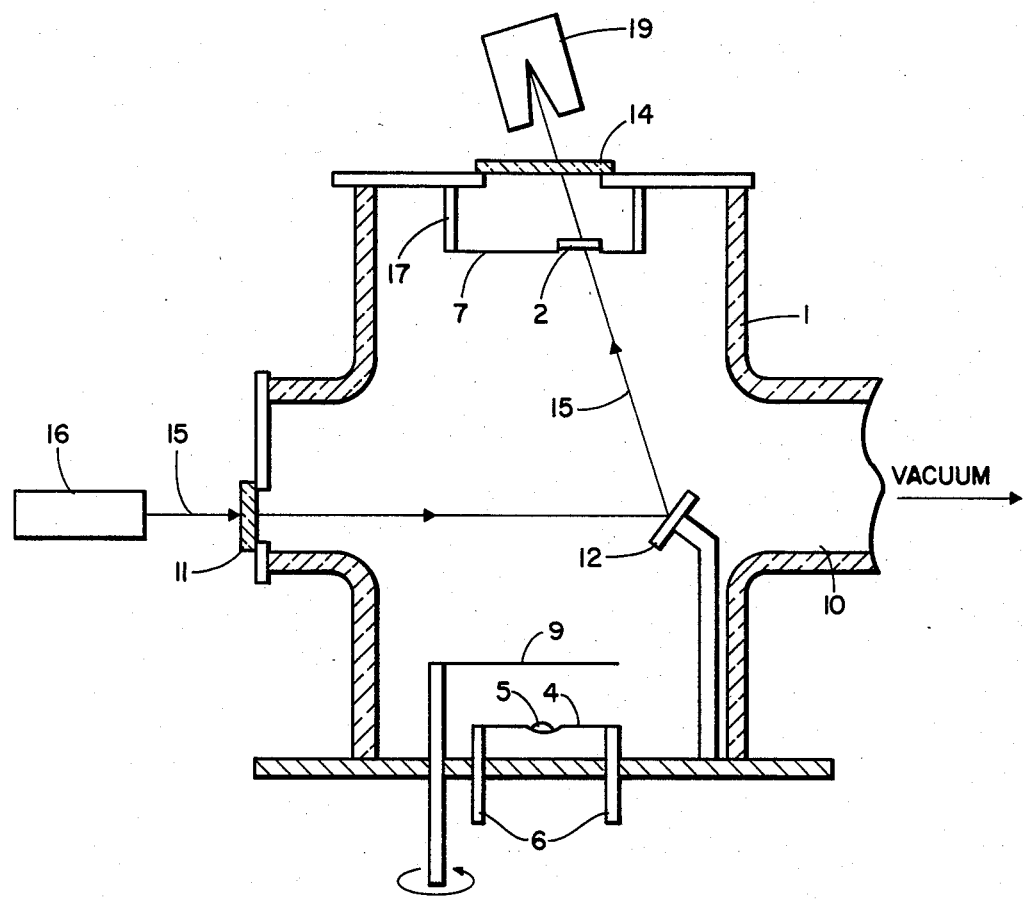

METHOD OF REDUCING OPTICAL COATING ABSORPTANCE

BACKGROUND OF THE INVENTION

1. Field of the Invention

The present invention relates to thin film coatings for optical components, and more particularly, to a method of reducing the absorptance of thin film optical coatings, especially applicable in the field of laser optics.

2. Description of the Prior Art

In optical systems such as high power lasers, for example, the high absorptance of thin film coatings applied to optical components has become a severe problem to overcome. High absorptance causes excessive heat which in turn causes distortion and frequent damage to such components, thus limiting the desired high power performance. It has been found that the absorption coefficient of a thin coating deposited on an optical component can be, and generally is, thousands of times greater than that of the same coating material in bulk form. Since such coatings are necessary to provide the desired optical properties, this problem has become severe. Even when the fraction of absorbed light is optically tolerable, it may cause an unsatisfactory degree of heating.

In conventional practice, methods of limiting absorptance have consisted of careful cleaning, removing impurities from materials used, paying strict attention to deposition conditions, and the like. However, the high remaining absorptance is due to other factors.

U.S. Pat. No. 4,115,163 to Gorina et al discloses a method of growing an epitaxial semiconductor film on a substrate without incorporating defects and impurities in the film, which comprises cleaning and heating the substrate before and during the epitaxial growth by means of irradiating the substrate with an intensive luminous flux from a powerful light source.

While not relating to optical coatings but treating an already-formed semiconductor film with means similar to that used in the present invention, U.S. Pat. No. 4,059,461 to Fan et al describes scanning the semiconductor film with a focused laser beam. The laser is made to heat the film above a certain temperature.

U.S. Pat. No. 4,131,487 to Pearce et al also describes a method of reducing defects in a semiconductor wafer which includes directing a high energy laser beam on the wafer, followed by heating the wafer to draw away defects. This is done before forming the solid-state electronic devices on the wafer.

SUMMARY OF THE INVENTION

It is an object of the present invention to provide a means and method for reducing the optical absorptance of thin film coatings on optical components, both at surfaces or film interfaces and within the film.

Another object is to enable reduction of the thin film absorptance of coatings on optical laser components especially for the wavelengths of light or other radiation produced by or used in the particular laser or other device.

It is a further object of this invention to provide reduction of such absorption during formation of the optical coating.

Briefly, our invention comprises irradiating an optical component or substrate with a medium power electromagnetic energy beam, at the same time as producing a thin optical coating on a surface of the substrate. The electromagnetic beam should have a wavelength at or near the same wavelength as that used in the operation of the optical component for which it is intended.

BRIEF DESCRIPTION OF THE DRAWING

The accompanying drawing is a diagram of a vacuum deposition apparatus modified for use in the process of this invention.

DESCRIPTION OF THE PREFERRED EMBODIMENT

Referring to the drawing, a vacuum chamber 1 such as a Pyrex "T" contains the usual elements for performing vacuum deposition of a thin film optical coating on a substrate 2. An evaporation boat 4 carries an evaporant material 5 which is heated to vaporization through electrical heater connections 6, for example. A substrate holder 7 located at the upper part of chamber 1 holds the substrate 2 which is the optical component to be coated. A movable shutter 9 above the boat 4 may be used to block the vapor path between the evaporant 5 and substrate 2. At the right-hand side of the chamber 1, a passage 10 leads to vacuum pump apparatus (not shown) which may include a gate valve, liquid nitrogen trap, and diffusion pump or the like.

To provide for the present invention, the chamber 1 is also provided with an optical input window 11, made of $CaF_2$ for example, for admitting a light beam with which to irradiate the substrate 2. A suitable mirror 12 may also be positioned in the chamber 1 to direct this light beam toward the substrate 2. The mirror 12 is located out of the line of sight between the evaporant 5 and the substrate 2, and is also preferably positioned so that its reflecting surface is not facing the evaporant source. An output window 14 is also located in the upper side of the chamber 1, for use in measuring the beam power from outside the chamber.

In practising the present invention, a beam of light 15 from an optical radiator 16 of sufficient power is directed to irradiate the surface of the substrate 2 during the time the optical coating is being deposited thereon by the vaporized coating material 5. The light beam 15 is of sufficient cross section area at the substrate 2 to irradiate substantially the entire surface being coated. Suitable beam forming optics (not shown) are of course used as required to secure the desired beam size and shape. The beam 15 is selected to have a high output in the spectral region for which the coating absorptance is to be low. This results in the removal or prevention of forming of the undesired light absorbing qualities or species in the optical coating being deposited. Conventional optical coating materials are used. No special purification precautions are necessary beyond reasonable care. As is customary, heating the substrate 2 aids in the process of film deposition. For this purpose, the substrate holder 7 can be an aluminum plate heated by internal electrical heater windings supplied through heater feed-throughs 17.

As mentioned previously, this invention is particularly useful in present-day laser optics since high absorptances are unsatisfactory at the laser powers in common use. Thus, the use of a CO laser, having a strong output in the 5.3 micro-meter range, to irradiate $SrF_2$ and $CaF_2$ substrates during coating deposition represents a typical example of the optical radiator 16. A continuous wave laser is preferred, although the invention obviously encompasses the use of a pulsed laser. For other applications, choice of an HF laser or a DF laser at 2.7 or 3.8 micro-meters, respectively, will be useful with other substrates and compatible coating materials.

Although the present concept utilizes the laser radiation particularly during the actual vapor deposition time period, the radiation may also be employed preceding or following the deposition for a short time if desired. Besides including laser radiation, the scope of the present invention also extends to other electromagnetic radiation of luminous flux or energy at other wavelengths, including infrared, visible, and ultraviolet, for example. It can also be used in conjunction with other techniques such as glow discharge purification and the like, if desired, although this laser-assisted deposition of itself involves a cleaning effect. This process can also be accompanied by various substrate heating or cooling steps.

Further, this invention is applicable with other thin film deposition methods besides the vacuum deposition described, such as with sputtering and ion vapor depositions, for instance. The same purpose will be achieved—that of substantially reducing the absorptance of optical coatings, either on transmissive or reflective optics.

The use of our invention is illustrated by the following particular example.

The distance from evaporant source to substrate 2 was approximately 40 cm. The evaporant material $ThF_4$ was placed in the boat 4, and a substrate 2 of $SrF_2$ to be coated was placed on the substrate holder 7. In a test for comparison purposes, an identical control substrate (not shown) was placed beside the substrate 2 and coated simultaneously, but not irradiated by the laser beam. The chamber 1 was evacuated to a base pressure of $1 \times 10^{-6}$ torr. The boat 4 was heated to normal vaporization temperature for the $ThF_4$, and the substrates heated to 400 degrees K. A period of two hours was allowed for all parts to reach thermal equilibrium.

At this time the laser irradiation and coating process was started. The CO laser beam 15 was controlled to a diameter of 12 mm at the substrate 2 being irradiated. After passing through substrate 2 and output window 14, the beam power was measured by an external power meter 19. The beam power was 20 watts, which produced a relatively low power intensity of approximately 18 $W/cm^2$. Heating of the substrate due to the laser beam is negligible.

The deposition was continued until a coating thickness of about one micro-meter was obtained, at a rate of about 25 Angstroms per second. Then the process was stopped and the apparatus allowed to cool to room temperature.

The absorptance of the substrate 2 and of the control substrate not laser-irradiated was measured by conventional laser calorimetry before and after coating. The change in absorptance for the control substrate not irradiated was $\Delta A = A(\text{coated}) - A(\text{uncoated}) = 2.97 \times 10^{-4}$. The corresponding change in absorptance for the laser irradiated substrate 2 was $-1.38 \times 10^{-4}$, indicating that the absorptance was less after coating than before.

The specific temperature of the substrate being coated is not critical in this invention. The laser power need only be sufficient to produce the necessary low value of absorptance.

While in order to comply with the statute, the invention has been described in language more or less specific as to structural features, it is to be understood that the invention is not limited to the specific features disclosed, but that the means and construction herein disclosed comprise the preferred mode of putting the invention into effect, and the invention is therefore claimed in any of its forms or modifications within the legitimate and valid scope of the appended claims.

What is claimed is:

1. The method of producing a low absorptance optical coating on an optical substrate, comprising vacuum depositing a thin film of optical coating material on a surface of a substrate while simultaneously irradiating said surface with a beam of light radiation having a wavelength corresponding to that at which the low absorptance is desired and having a power sufficient to cause the desired effect.

2. Method in accordance with claim 1 wherein said substrate is heated to at least 400° K. during said deposition.

3. Method in accordance with claim 1 wherein said light radiation is from a laser.

4. Method in accordance with claim 1 wherein said light radiation is from a continuous-wave laser.

5. Method in accordance with claim 1 wherein said beam is formed to have a cross section area at said substrate substantially commensurate with the coating being produced.

6. The method of providing an optical component with a reduced-absorptance optical coating, comprising irradiating a surface of said component with high energy electromagnetic radiation while simultaneously depositing on said surface a thin film optical coating, said radiation having an intensity great enough to produce said reduced absorptance.

7. Method in accordance with claim 6 wherein said radiation is from a laser having a substantial output at the wavelength for which said aborptance is to be reduced.

8. Method in accordance with claim 7 wherein the heating of said component from said laser radiation is negligible.

9. A low absorptance optical coating produced by the method of claim 6.

* * * * *